United States Patent
Dussert-Vidalet et al.

(10) Patent No.: US 8,822,985 B2
(45) Date of Patent: Sep. 2, 2014

(54) DIODE AND PROCESS FOR MAKING AN ORGANIC LIGHT-EMITTING DIODE WITH A SUBSTRATE PLANARISATION LAYER

(75) Inventors: Bruno Dussert-Vidalet, La Garde (FR); Mohamed Ben Khalifa, Hyeres (FR); Hélène Cloarec, Hyeres (FR); Florent Monestier, Toulon (FR)

(73) Assignee: Astron Fiamm Safety SARL, Toulon (FR)

( * ) Notice: Subject to any disclaimer, the term of this patent is extended or adjusted under 35 U.S.C. 154(b) by 432 days.

(21) Appl. No.: 13/376,993

(22) PCT Filed: Jun. 15, 2010

(86) PCT No.: PCT/EP2010/058337
§ 371 (c)(1),
(2), (4) Date: Mar. 2, 2012

(87) PCT Pub. No.: WO2010/146027
PCT Pub. Date: Dec. 23, 2010

(65) Prior Publication Data
US 2012/0153336 A1   Jun. 21, 2012

Related U.S. Application Data

(60) Provisional application No. 61/222,658, filed on Jul. 2, 2009.

(30) Foreign Application Priority Data
Jun. 15, 2009  (FR) ...................... 09 53963

(51) Int. Cl.
*H01L 29/08*   (2006.01)
*H01L 21/00*   (2006.01)
*H01L 51/52*   (2006.01)

(52) U.S. Cl.
CPC ............ *H01L 51/52* (2013.01); *H01L 51/5265* (2013.01); *H01L 51/5206* (2013.01)
USPC ............... 257/40; 257/98; 257/102; 257/432; 438/29

(58) Field of Classification Search
CPC ............ H01L 51/0032; H01L 51/5072; H01L 51/5056; H01L 33/50; H01L 51/5088; H01L 33/60
See application file for complete search history.

(56) References Cited

U.S. PATENT DOCUMENTS 5,739,545 A * 4/1998 Guha et al. ...................... 257/40
8,008,651 B2 * 8/2011 Kumaki et al. ................... 257/40
(Continued)

FOREIGN PATENT DOCUMENTS

WO   2007/004106 A1   1/2007

OTHER PUBLICATIONS

Cho H et al: "Highly flexible organic light-emitting diodes based on ZnS/Ag/WO3 multilayer transparent electrodes" Organic Electronics, Elsevier, Amsterdam, NL, [Online] vol. 10, No. 6, Jun. 10, 2009, pp. 1163-1169, XP026348802 ISSN: 1566-1199 [retrieved on Jun. 10, 2009] p. 1165, col. 2, line 1-line 5.

Liu X et al: "The design of ZnS/Ag/ZnS transparent conductive multilayer films" Thin Solid Films, Elsevier—Sequoia S.A. Lausanne, CH LNKDDOI: I0.I016/S0040-6090(03)00141-X, vol. 441, No. 1-2, Sep. 22, 2003, pp. 200-206, XP004450854 ISSN: 0040-6090 p. 201, col. 2, line 1, paragraph 4.1—p. 202, col. 1, line 7.
(Continued)

*Primary Examiner* — Alonzo Chambliss
(74) *Attorney, Agent, or Firm* — Young & Thompson

(57) ABSTRACT

An organic light-emitting diode (OLED) on a transparent substrate includes a microcavity formed between a reflecting cathode and semi-reflecting anode. The microcavity includes multiple organic layers with at least one light-emitting layer. The OLED is characterized by a transparent planarization layer between the substrate and an upper metallic layer forming the OLED semitransparent anode. A process for making such an OLED is also described.

19 Claims, 6 Drawing Sheets

(56) References Cited

U.S. PATENT DOCUMENTS

| | | |
|---|---|---|
| 8,664,044 B2 * | 3/2014 | Jin et al. ................. 438/110 |
| 2005/0179369 A1 | 8/2005 | Ohshita et al. |
| 2007/0069996 A1 | 3/2007 | Kuba et al. |
| 2008/0299365 A1 | 12/2008 | Choi et al. |

OTHER PUBLICATIONS

International Search Report, dated Sep. 9, 2010, from corresponding PCT application.

* cited by examiner

DIODE AND PROCESS FOR MAKING AN ORGANIC LIGHT-EMITTING DIODE WITH A SUBSTRATE PLANARISATION LAYER

TECHNICAL FIELD OF THE INVENTION

The present invention relates to organic light-emitting diodes (OLEDs), in particular those comprising a microcavity with light emission through the substrate. This invention more particularly describes a process for improving the flatness of the substrate in order to increase the effectiveness of light extraction.

STATE OF THE ART

OLEDs are electronic devices which emit light when a potential difference is applied to them. In 1987, Tang et al of Kodak were the first to reveal OLEDs with large luminous efficiency in the journal 'Applied Physics Letters', followed by the 'Journal of Applied Physics' in 1989. Since then, many OLED structures with improved performances, including those using polymers, have been described.

Such an electronic device, emitting light downwards (100) through a transparent substrate (140), is presented in FIG. 1. The device includes a lower transparent electrode (130), an organic light-emitting structure (120) in which electron-hole type conduction can develop, and an upper reflective metallic electrode (110). Generally, the light-emitting organic structure is itself laminated and can include a hole injection layer (129), a hole transport layer (127), a light-emitting layer (125) produced by the combination of holes and electrons, an electron transport layer (123) and an electron injection layer (121). The lower transparent electrode (130) constitutes the anode of the device whereas the upper reflective metallic electrode (110) is the cathode.

Generally, the anode consists of a transparent oxide, such as indium tin oxide (ITO). Unfortunately this oxide presents problems during the operation of the OLED:

indeed, oxygen and indium migration in the organic layer due to the internal electrical field causes its degradation in the long term as stated by Schlatmann et al. in 'Applied Physics Letters', 69, 1764 (1996). Thus, the electrical properties of the ITO depend to a large extent on the treatment of its surface as published by Li et al. in 'Thin Solid Films', 477, 57 (2005). Furthermore, the output of the ITO limits hole injection and consequently the effectiveness of the OLED as reported by Zhou in 'Applied Physics Letters', 74, 609 (1999). Moreover the cost of the ITO has increased strongly these last few years due to inflation of the price of indium. On the other hand, the ITO has sufficient conductivity for display applications when the individual pixels are less than 1 mm (millimeter), but the conductivity of such a transparent electrode has proved to be insufficient for applications where recourse to larger active surfaces are required in the case of lighting. Indeed, to develop OLEDs with a large active surface, significant improvements in terms of efficiency and life are still required as noted by Ikai et al., in 'Applied Physics Letters', 79, 156 (2001).

Although ITO is generally only slightly rough, that is to say a few nm (nanometer), conduction peaks of several tens of nm of current can nevertheless be observed on its surface (G. Lue et al. in 'Synthetic metals', 144, 1 (2004)). These surface irregularities on the ITO may generate conduction paths in the diode by stacking of the organic layers leading to so-called hot points and to short circuits, see for example: K. B. Kim et al. in 'Japan Journal of Applied Physics', 42 (2003), pp L438-L440.

To mitigate the above problems, ie. cost of the ITO and peaks, the anode made of ITO could be replaced by a single, purely metallic semitransparent layer laid on a glass substrate or a flexible plastic substrate. This idea of a metallic layer has recently been experimented and the results obtained were published in 'Applied Physics Letters', 87, 173505, (2005) by Peng et al. On the other hand, the glass or plastic substrate requires intense cleaning due to the presence of a high concentration of dust. However this cleaning appears to be insufficient to eliminate dust particles smaller than 1 μm (micrometer or micron). This dust can create conduction paths similar to the ITO peaks, inducing short-circuits within the diode or the formation of black spots in the active surface.

This then is one of the main aims of the invention: overcome the problems described above by a process that gives a good quality of substrate even if the dust particles are large.

Other characteristics, aims and advantages of the present invention will come to light on reading the following detailed description and appended drawings. It is understood that it may incorporate other advantages.

SUMMARY OF THE INVENTION

The invention describes an organic light-emitting diode (OLED) built on a substrate. It includes a microcavity formed between a cathode and an anode. The microcavity includes a plurality of organic layers comprising at least one light-emitting layer. It is characterized in that it includes a planarisation layer between the substrate and an upper metallic layer constituting one of the electrodes. Advantageously, the thickness and the roughness of the planarisation layer are controlled to improve the electro-optical characteristics of the OLED.

According to a non-restricting possibility:
the planarisation layer is made of a material that includes zinc sulphide (ZnS) and/or zinc selenide (ZnSe),
the roughness of the planarisation layer is less than that of the substrate,
the thickness of the planarisation layer is configured to absorb all the dust present on the substrate,
the thickness of the planarisation layer is less than or equal to one micron,
the anode consists of a layer of silver (Ag) or aluminium (Al) or a silver (Ag) and aluminium (Al) alloy thin enough to be semitransparent.
the substrate is a sheet of glass,
the diode is configured to emit light through the substrate, the planarisation layer being transparent and the metallic layer constituting the anode,
it is configured to emit light via the side of the microcavity opposite the substrate, in which the upper metallic layer is at least semi-reflecting.

Moreover, the invention describes a process for making an organic light-emitting diode (OLED) of this type built on a substrate and including a microcavity formed between a cathode and an anode, the microcavity including a series of organic layers with at least one light-emitting layer.
Process characterised in that:
a planarisation layer is deposited on the substrate prior to the deposit of a metallic layer destined to constitute one of the electrodes.
Advantageously:
deposit of the planarisation layer takes place by vapour evaporation under vacuum of a material including zinc sulphide (ZnS) and/or zinc selenide (ZnSe);
the thickness of the deposited planarisation layer is controlled so that its roughness is less than that of the underlying transparent substrate;

the thickness of the deposited planarisation layer is controlled so that the thickness of the planarisation layer absorbs all the dust remaining present on the substrate, the planarisation layer is a layer of zinc sulphide (ZnS), the planarisation layer is a layer of zinc selenide (ZnSe), depositing of the planarisation layer by vapour evaporation under vacuum takes place at low temperature with a slow buildup rate, the anode is deposited on the planarisation layer by thermal evaporation under vacuum of a layer of silver (Ag) or aluminium (Al) or a silver (Ag) and aluminium (Al) alloy that is thin enough to be semitransparent.

the upper metallic layer constitutes the anode; the substrate and the planarisation layer are transparent in order to form a light emitting diode through the substrate, the anode is deposited on the planarisation layer by thermal evaporation under vacuum of a layer of silver (Ag) or aluminium (Al) or a silver (Ag) and aluminium (Al) alloy that is thin enough to be semitransparent, the upper metallic layer is at least semi-reflecting in order to constitute a diode emitting light via the side of the microcavity opposite the substrate, the planarisation layer is deposited on a glass substrate.

BRIEF DESCRIPTION OF THE FIGURES

The goals, aims, and the characteristics and advantages of the invention will be better highlighted by the detailed description of one embodiment of the latter which is illustrated by the following accompanying drawings in which.

The drawings attached are given by way of examples and are not exhaustive.

DETAILED DESCRIPTION OF THE INVENTION

Figure 1:
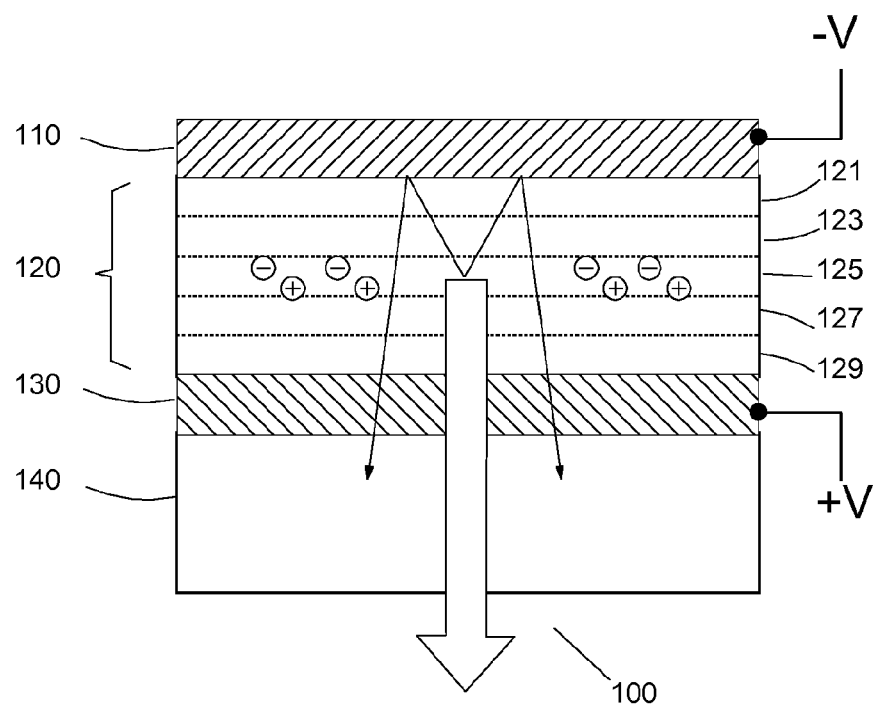
FIG. 1 shows a OLED representing the prior art.
Figure 2:
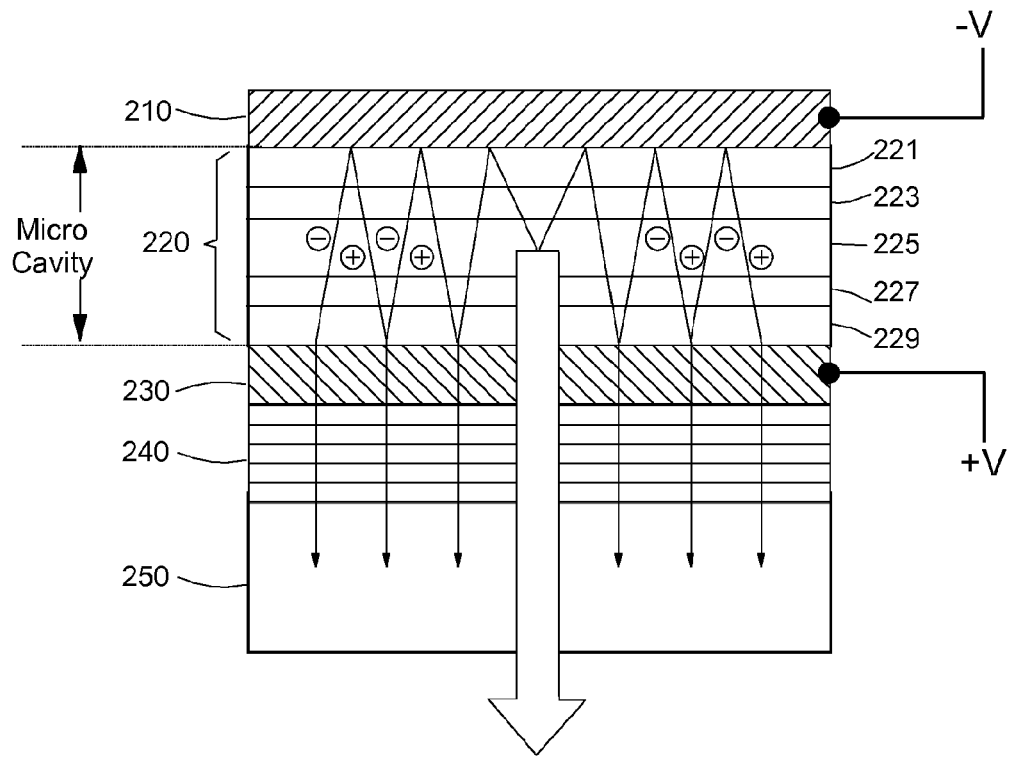
FIG. 2 shows one example of the structure of an organic light-emitting diode according to the invention including a planarisation layer of substrate.

FIG. 2 describes the structure of an organic light-emitting diode based on the invention according to a possible embodiment described hereafter for a so-called downward emitting diode. This type of OLED emits the light downwards, i.e. through a substrate that is at least partially transparent (250), for example glass, which is also the mechanical support for the device. The term "transparent" generally means that it has a rate of transmission above 70% in the visible field. A layer of zinc sulphide (ZnS) or zinc selenide (ZnSe) is deposited on the glass substrate by thermal evaporation. Advantageously, layer (240) is at least 200 nm thick and is preferably more than 500 nm thick. In the examples given hereafter, the planarisation layer (240) is installed in only one stage. This case is not restrictive and the invention covers the formation of a planarisation layer in several strata obtained by a succession of deposits. Metal anode (230) is deposited directly on this deposit. Anode (230) for example consists of a layer of silver (Ag). This anode (230) is less than 50 nm thick (its typical value is a few tens of nanometers) so as to remain semi transparent in the range of visible light wavelengths. For the example given in the application, by semi transparent is meant a layer that allows the light to pass through partially and reflects the light partially. The rate of reflection is usually above 50% in the entire visible field. Anode (230) constitutes the lower mirror of microcavity (220) which will be formed after the deposit of upper electrode (210).

In other embodiments, the anode may be made in aluminium (Al) or a silver-aluminium alloy by co-evaporation.

The following five organic layers are deposited successively between anode (230) and cathode (210):

A first organic layer (229) measuring a few tens of nanometers serves to facilitate the transport of the holes injected by anode (230) when connected to a positive voltage. It is immediately located on top of the latter. The material used can be doped (type P doping) to encourage hole conduction (i.e. by electron deficiency). When associated with the underlying anode, the layer of electrical resistance (229) can then be very low.

The next organic layer (227), which is 10 or so nanometers thick, blocks the electrons that could come from the upper layers and would then combine in the underlying organic layer which is used to facilitate hole transport (instead of combining normally in the light-emitting intermediate layer).

Transition layer (225) is the organic layer in which electrons and holes combine and light is emitted. The thickness depends on the material used based on the colour of the light to be emitted.

Layer (223) located immediately above the emitting layer of light blocks the holes from the lower layers. This layer plays a dual role in relation with layer (227) which serves to block the electrons. It has an equivalent thickness. Together they confine the combination of the electron-hole pairs to the intermediate light-emitting zone (225).

Upper organic layer (221) facilitates the transport of the electrons which are injected by the cathode when connected to a negative voltage. The material used can be doped (N type doping) to encourage conduction by excess of electrons. When associated with the metal layer forming reflective cathode (210), the layer electrical resistance is then very weak and unrelated to its thickness. As in the case of the lower doped layer, its thickness is a few tens of nanometers.

The structure of the organic layers described above which overlays (if one omits the layers blocking the electrons and the holes) a type P doped layer, a non-doped layer (intrinsic: I) of a luminescent material and a doped layer of type N, form a structure known as PIN. The materials used for the organic structure, doped or otherwise, advantageously all have the same index of refraction (close to 1.7) so as not to create internal reflections which would affect the transmission of light emitted from the intermediate transmitting layer (225). All these materials are available commercially. They can be easily deposited by thermal evaporation under vacuum.

Figure 3:
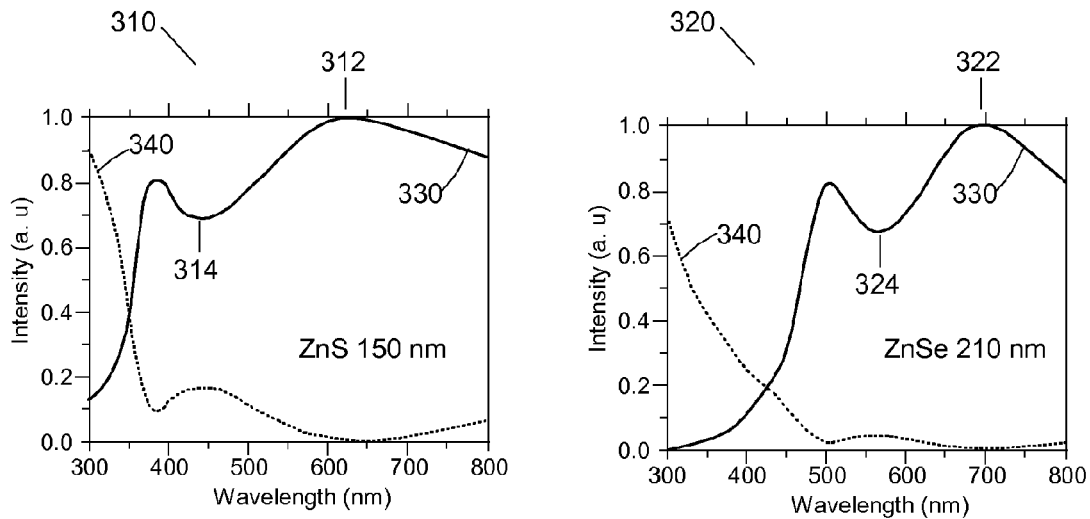
FIG. 3 shows the transmission and absorption of light in the range of wavelengths visible by the layers of ZnS and ZnSe.

FIG. 3 shows the transmission (330) and absorption (340) of light in the range of visible wavelengths by layers of ZnS (310) and ZnSe (320) with thicknesses of 150 nm and 210 nm respectively. These optical properties are close to those of ITO. ZnS and ZnSe transmission reaches a maximum of 99% at a wavelength of 620 nm (312) for the first and 690 nm (322)

for the second. The minimum transmission of ZnS and ZnSe corresponds to 68% and 66% transmission respectively. These values are obtained at a wavelength of 440 nm for ZnS (314) and 560 nm for ZnSe (324).

Figure 4:
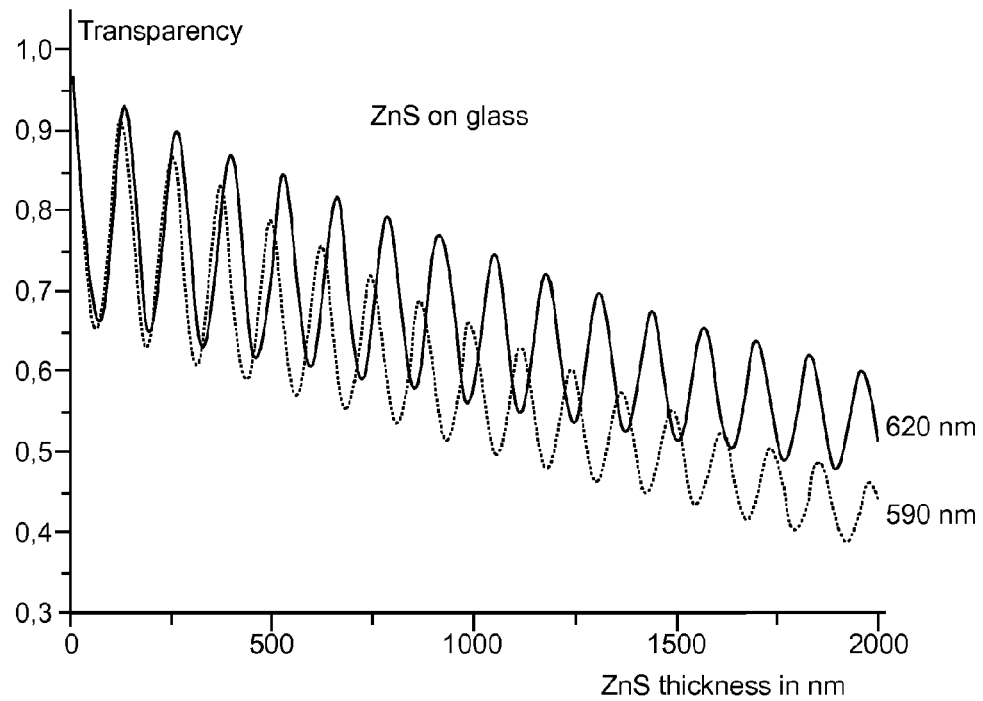
FIG. 4 shows the transmission of ZnS light as a function of the layer thickness.

The transmission of ZnS light based in the thickness is given in FIG. 4 for thicknesses of up to 2 μm (2000 nm) for two wavelengths: 590 nm (orange) and 620 nm (red). An oscillation and a reduction in the mean transmission is noted as the thickness of the layer of ZnS increases. At 620 nm, the transmission of a layer of ZnS is equal to 74% for a thickness of 1.04 μm. At 590 nm, it is 71% for a thickness of 760 nm.

Figure 5:
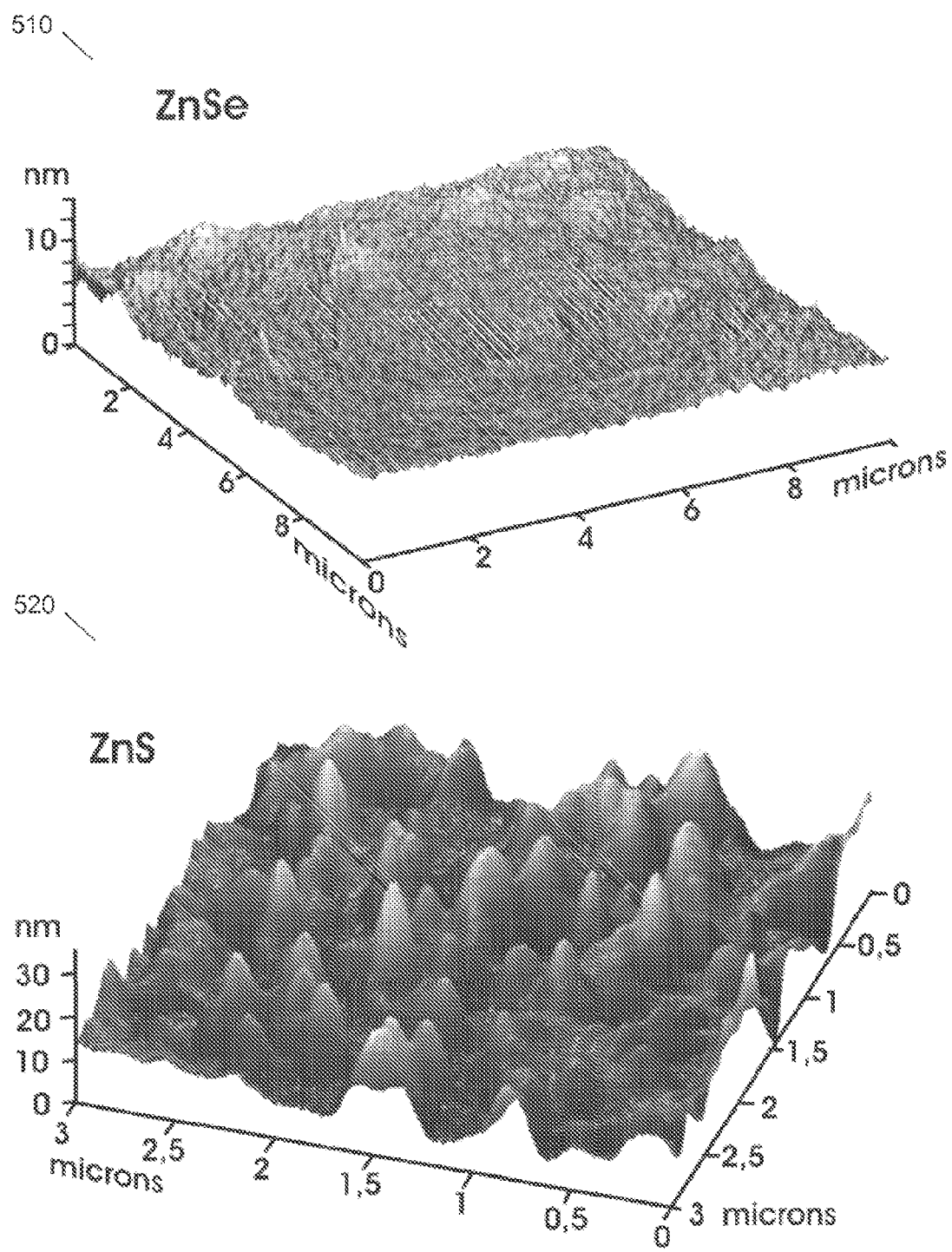
FIG. 5 shows the results of the roughness measurements obtained with ZnS and ZnSe.

To characterize the flatness and the homogeneity of the ZnS layer, FIG. 5 gives results for measurements with a specialized microscope, so-called AFM ("atomic force microscope"), of a layer of 400 nm of ZnS and 200 nm of ZnSe. Measurements give an average roughness of 3.7 nm for ZnS (520) and 0.4 nm for ZnSe (510). Surfaces present ZnS peaks of less than 30 nm and ZnSe peaks of less than 12 nm. By comparison, the ITO peaks for such thicknesses would be above 100 nm. These measurements show the advantage of using ZnS or ZnSe to form a uniform, homogeneous and flat layer on a glass substrate.

In order to check the capacity of ZnS to completely cover the dust and render the surface flat, aluminum studs were deposited to simulate the presence of dust on the substrate. The aluminum studs are 1 μm thick and 41 μm wide and are deposited with a period of 64 μm. The thickness of the aluminum studs corresponds to the maximum thickness of dust remaining at the end of cleaning. That said, the maximum size of the dust particles can vary and the thickness of the layer of planarisation can be adapted to this size.

Figure 6:
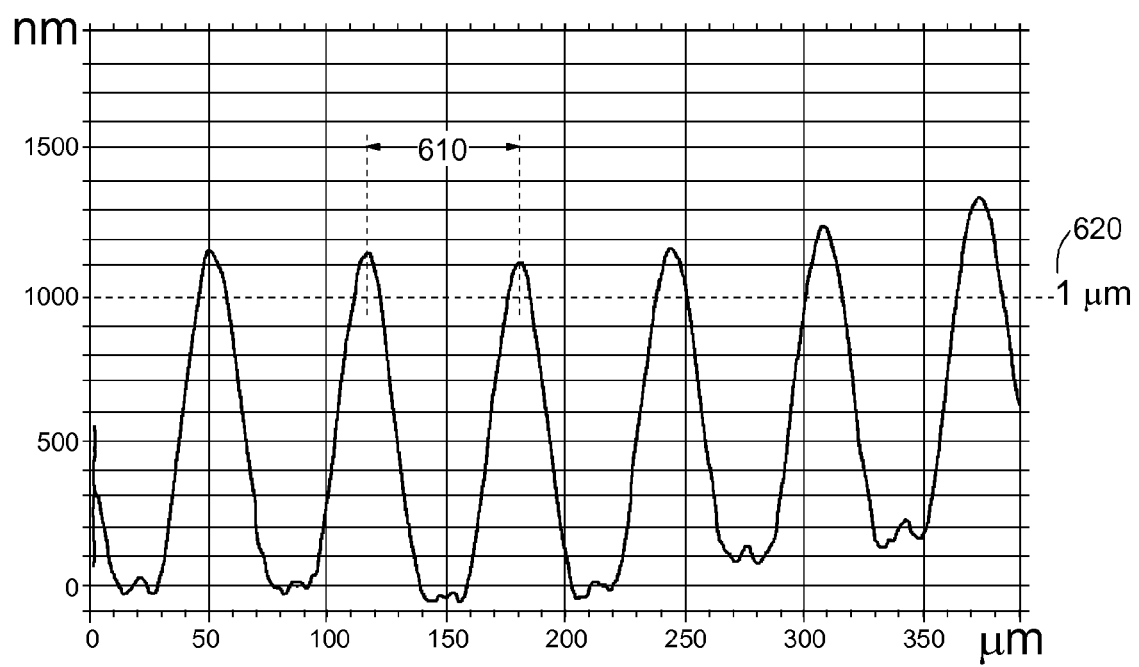
FIG. 6 shows a section of aluminium studs destined to simulate the presence of large dust particles.

The variation of the thickness of a section through the center of the aluminum studs measured with a mechanical profilometer is shown in FIG. 6. Some studs are more than 1 μm (620) with a frequency of repetition of approximately 65 μm (610). These studs are then covered by a 1 μm thick layer of ZnS. Using a scanning electron microscope, it is observed that, for samples with aluminum studs covered by a layer of ZnS, the total variation is only around 120 nm, ie 9 times less than the initial thickness of the aluminum studs.

These results show the capacity of the ZnS to fill homogeneously the space between the aluminum studs and then form a homogeneous layer over them without leaving empty spaces between them.

Figure 7:
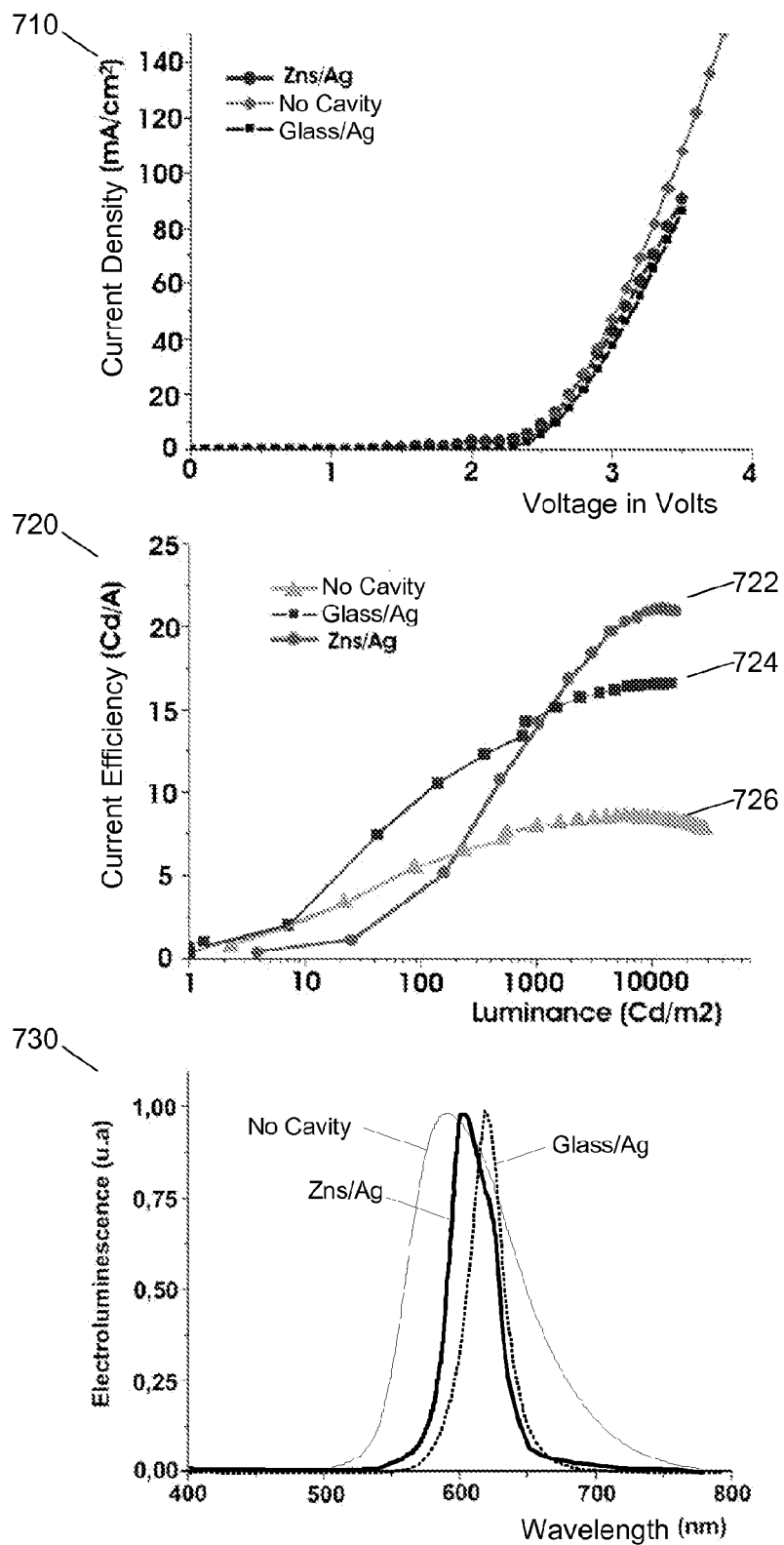
FIG. 7 compares the experimental results obtained with a device according to the invention using ZnS and conventional embodiments.
Figure 8:
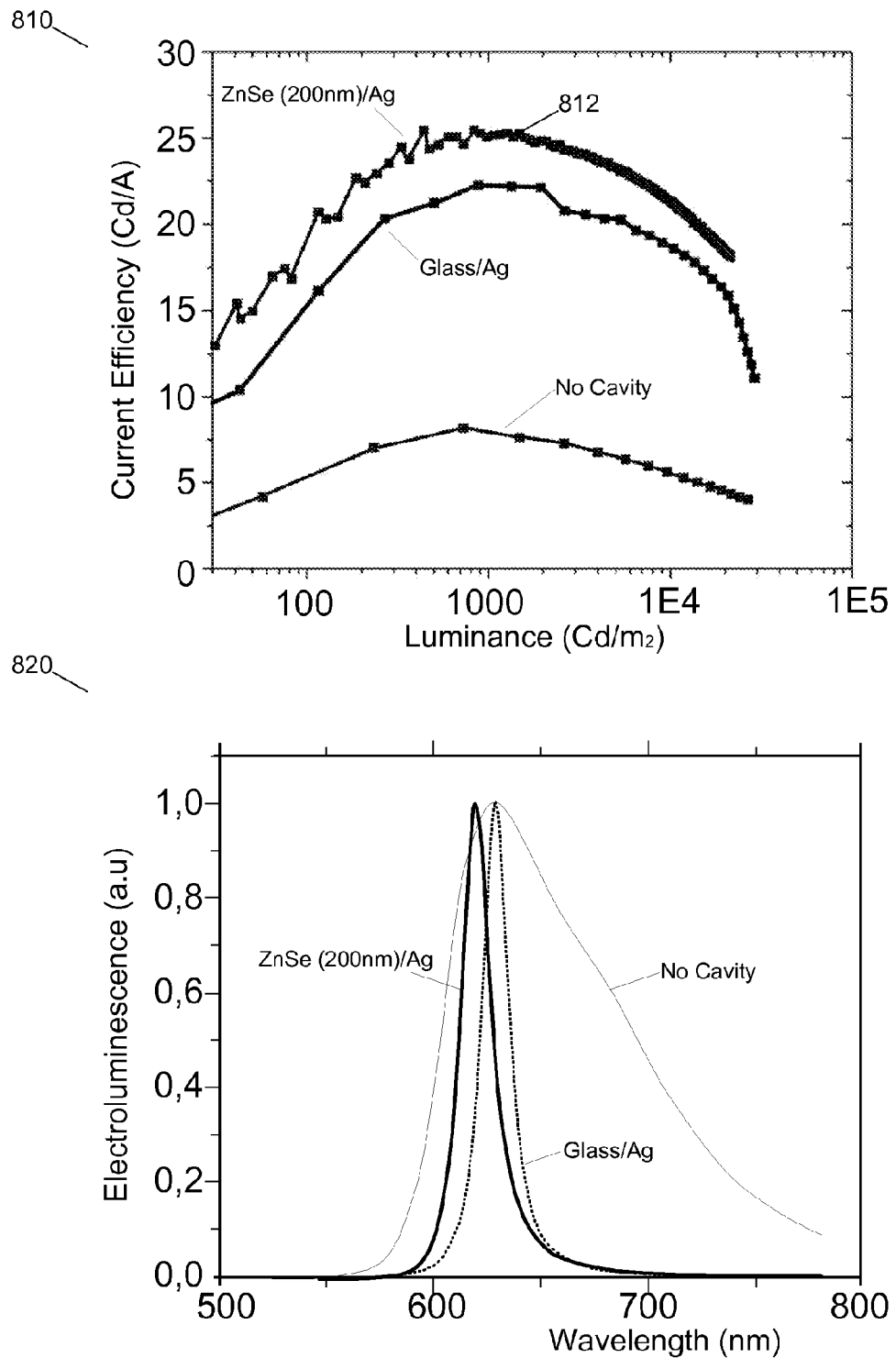
FIG. 8 compares the experimental results obtained with a device according to the invention using ZnSe and conventional embodiments.

The advantages resulting from the use of these materials as a planarisation layer when making the OLED devices are shown in FIGS. 7 and 8 below. On the one hand with an orange OLED cavity in which ZnS is used like a planarisation layer and on the other with a OLED red cavity in which ZnSe is used as a planarisation layer on an active surface of 1 cm$^2$. In these experiments, ZnSe or ZnS is deposited on the glass substrate by thermal evaporation. Silver was used as a semi-transparent anode and reflective cathode in a P-I-N cavity. The thickness of the ZnS layer is optimized so as to obtain the best possible light-emitting efficiency. It is 1 micron. The ZnSe is 200 nm thick.

FIG. 7 compares the density curve for the current obtained with a planarisation layer made of ZnS, with two other embodiments without ZnS (710). The values are expressed in milliamperes (mA) per cm$^2$ based on the voltage. It is noted that the intermediate layer of ZnS between the glass and silver does not have an effect on the current density, which implies that the layer of silver is thick enough to allow correct injection into the doped layer P and that the interface with the layer of ZnS does not affect the electrical properties of the silver.

FIG. 7 also gives the current efficiency or output (720) expressed in candela per amp (Cd/A) based on the brightness expressed in candela per m$^2$ (Cd/m$^2$). The maximum output reaches 22 Cd/A with 1000 nm of ZnS (722). This is to be compared with 8 Cd/A and 17 Cd/A obtained respectively with the non-cavity glass/ITO (726) and cavity glass/Ag (724) diodes. The use of a planarisation layer like ZnS, evaporated thermally, brings the possibility of modulating the thickness of the intermediate layer between the substrate and the layer of silver, thereby achieving higher light extraction efficiency than with a cavity without ZnS. As to the diodes without cavity, they have maximum electric efficiency of 8 Cd/A. Moreover, the success rate of diode lighting is 100% with those that use ZnS as the planarisation layer. It is less than 60% for the glass/ITO diodes and the glass/Ag diodes. FIG. 7 also shows the light-emitting spectrum obtained with the three types of devices (730).

Similar results were obtained with a ZnSe planarisation layer. In this case, the active layer is formed by an organic compound doped with a red phosphorescent product. These results are shown in FIG. 8 which shows the current efficiency (810) of compared devices as above. Maximum efficiency (812) reaches 26 Cd/A with 200 nm of ZnSe, compared to 7 Cd/A and 22 Cd/A obtained respectively with the non-cavity glass/ITO and cavity glass/Ag diodes. The light-emitting spectra (820) show a shift towards the blue of OLEDs with ZnS or ZnSe due to the microcavity effect.

These results testify to the beneficial effect of ZnS or ZnSe when producing a planarisation layer. The results obtained show in particular that the presence of such a planarisation layer improves the optical coupling of OLEDs with a cavity, in particular but not exclusively, OLEDs designed to emit downwards through a transparent substrate, also called "bottom emission". More generally, the planarisation layer proposed here can be applied to diodes emitting upwards (called "top emission") to control the roughness of the substrate. In all the cases, it is advantageous that the planarisation layer is located between the substrate and the electrode and in contact with the substrate in order to cover it directly.

Below is an example of a structure that can be used for a top emission diode, i.e. side opposite the substrate. The substrate can be of various kinds without needing to be transparent or semitransparent. A single film of metal material (such as aluminium, silver, copper or alloys derived from these elements) will suffice. The substrate can also be multilayer and in particular bi-layer, of the metal/metal or metal/alloy or alloy/metal type. The above-mentioned metals and alloys are perfectly suitable due to their total industrial integration.

The planarisation layer, especially in ZnS or ZnSe, is deposited by evaporation on the substrate. A thickness of at least 50 nanometers, advantageously similar to the above-mentioned examples for a top emission diode through the substrate, will suffice.

To ensure that the light exits opposite the substrate, the electrode formed above the planarisation layer is at least semi-reflective. It can also be completely reflective. By semi-reflective is meant the fact that it reflects most of the rays it receives, and advantageously at least 60% and over the entire visible field. A film of aluminum, silver or gold would be suitable, especially at thicknesses of 50 nanometers at least.

For both types of diodes, the planarisation layer, in selected material (ZnS or ZnSe or their association) provides surprisingly an optimal surface quality without impacting the optical quality of the diode.

Thus, the aims of the invention are clearly achieved by thermal evaporation under vacuum of a thick layer of zinc sulphide (ZnS) or zinc selenide (ZnSe). Indeed, the layer obtained is flat and has a constant thickness. It is compact and avoids the formation of defects on the surface which would otherwise deteriorate the flatness of the metal semi-transparent anode that has to be deposited directly on it. The planarisation layer is slightly rough. No roughness that could pierce the upper layers and thereby cause the appearance of non-functional blackspots or short-circuits is detected.

Even when extremely thick, the polymerisation layer remains transparent and allows the extraction of a maximum amount of light through the substrate. ZnS and ZnSe are transparent in the visible wavelength range due to their low coefficient of extinction ($<10^{-5}$) and their forbidden broad band: respectively, 3.4 eV (electron volt) and 2.7 eV.

Moreover, it also has to be observed that ZnS and ZnSe can evaporate thermally at low temperatures. For example, for ZnS, a temperature ranging between 750° C. and 950° C. with a rate from 0.5 to 5 Å/s can be achieved. For ZnSe, a temperature ranging between 600° C. and 800° C. or a rate of 0.5 to 5 Å/s gives satisfaction. This not only enables the stoichiometry of the layer deposited to be controlled accurately, but also to modulate the thickness and the rate of evaporation in order to further attenuate the roughness and prevents the development of surface peaks.

Moreover, these materials have a high refraction index: 2.4 for ZnS and 2.6 for ZnSe. This increases the optical coupling of the diode, and increases the extraction of light in particular through the substrate from the central light-emitting layer.

The invention claimed is:

1. Organic light-emitting diode (OLED) with a substrate (250) and comprising a microcavity (220) formed between two electrodes consisting of a cathode (210) and a anode (230), the microcavity (220) including a plurality of organic layers with at least one light-emitting layer (225),
    characterized in that this includes a planarisation layer (240) between substrate (250) and an upper metallic layer forming one of the electrodes, planarisation layer (240) being made of a material including: zinc sulphide (ZnS), and/or zinc selenide (ZnSe) and with a roughness that is less than that of the substrate (250).

2. Diode according to claim 1 in which the thickness of the planarisation layer is configured to absorb all the dust present on the substrate (250).

3. Diode according to claim 1 in which planarisation layer (240) is a layer of zinc sulphide (ZnS).

4. Diode according to claim 1 in which planarisation layer (240) is a layer of zinc selenide (ZnSe).

5. Diode according to claim 1 in which the thickness of the polymerisation there is less than or equal to 1 micrometer.

6. Diode according to claim 1 in which anode (230) consists of a layer of silver (Ag) or aluminium (Al) or a silver (Ag) and aluminium (Al) alloy that is thin enough to be semitransparent.

7. Diode according to claim 1 in which the transparent substrate (250) is a sheet of glass.

8. Diode according to claim 1 configured to emit light through substrate (250), polymerisation layer (240) being transparent and the metal layer forming anode (230).

9. Diode according to claim 1 configured to emit light by the side of micro-cavity (220) opposite substrate (250) and in which the upper metal layer is at least semi-reflecting.

10. Process for making an organic light-emitting diode (OLED) with a substrate (250) and comprising a microcavity (220) formed between two electrodes consisting of a cathode (210) and an anode (230), microcavity (220) including a multiple organic layer with at least one light-emitting layer (225),
    process characterised in that a planarisation layer (240) is deposited on substrate (250) prior to the deposit of a metallic layer forming one of the electrodes by thermal evaporation under vacuum of a material including zinc sulphide (ZnS) and/or zinc selenide (ZnSe), the thickness of the deposited planarisation layer being controlled so that its roughness is least that of underlying transparent substrate (510, 520).

11. Process according to claim 10 in which the thickness of the deposit of the planarisation layer is controlled so that the thickness of the planarisation layer absorbs all the dust remaining present on the substrate.

12. Process according to claim 10 in which planarisation layer (240) is a layer of zinc sulphide (ZnS).

13. Process according to claim 12 in which depositing by thermal evaporation under vacuum of a planarisation layer is performed at a temperature of between 750° C. and 950° C. and a buildup rate of between 0.5 Å/s et 5 Å/s.

14. Process according to claim 10 in which planarisation layer (240) is a layer of zinc selenide (ZnSe).

15. Process according to claim 14 in which depositing by thermal evaporation under vacuum of a planarisation layer takes place at a temperature of between 600° C. and 800° C. and a buildup rate of between 0.5 Å/s et 5 Å/s.

16. Process according to claim 10 in which the upper metallic layer constitutes the anode; the substrate and the planarisation layer being transparent in order to constitute a diode emitting light through the substrate.

17. Process according to claim 16 in which anode (230) is deposited on the planarisation layer by thermal evaporation under vacuum of a layer of silver (Ag) or aluminium (Al) or a silver (Ag) and aluminium (Al) alloy that is thin enough to be semitransparent.

18. Process according to claim 10 in which the upper metal layer is at least semi-reflecting in order to form a diode emitting light by the side of the microcavity (220) opposite the substrate (250).

19. Process according to claim 10 in which the planarisation layer is deposited on a glass substrate.

* * * * *